(12) United States Patent
Yasuda

(10) Patent No.: US 8,456,727 B2
(45) Date of Patent: Jun. 4, 2013

(54) ACTUATOR DEVICE FOR OPTICAL DEFLECTOR

(75) Inventor: Yoshiaki Yasuda, Kanagawa (JP)

(73) Assignee: Stanley Electric Co., Ltd., Tokyo (JP)

( * ) Notice: Subject to any disclaimer, the term of this patent is extended or adjusted under 35 U.S.C. 154(b) by 652 days.

(21) Appl. No.: 12/750,714

(22) Filed: Mar. 31, 2010

(65) Prior Publication Data

US 2010/0245966 A1 Sep. 30, 2010

(30) Foreign Application Priority Data

Mar. 31, 2009 (JP) .................................. 2009-086040

(51) Int. Cl.
*G02B 26/08* (2006.01)

(52) U.S. Cl.
USPC .................. 359/224.1; 359/199.4; 359/200.8

(58) Field of Classification Search
USPC 359/198.1–199.1, 199.4, 200.8, 224.1–224.2
See application file for complete search history.

(56) References Cited

U.S. PATENT DOCUMENTS

| 5,606,447 | A | 2/1997 | Asada et al. |
|---|---|---|---|
| 7,605,965 | B2 | 10/2009 | Tani et al. |
| 7,605,966 | B2 | 10/2009 | Tani et al. |
| 2006/0023165 | A1 | 2/2006 | Ishihara et al. |
| 2007/0153235 | A1 | 7/2007 | Morikawa et al. |
| 2008/0225363 | A1* | 9/2008 | Saitoh et al. .................. 359/199 |
| 2011/0235003 | A1 | 9/2011 | Konno |

FOREIGN PATENT DOCUMENTS

| JP | S55-065940 A | 5/1980 |
|---|---|---|
| JP | H07-175005 A | 7/1995 |
| JP | 2000-258721 A | 9/2000 |
| JP | 2001-234331 A | 8/2001 |
| JP | 2002-62582 A | 2/2002 |
| JP | 2002-177765 A | 6/2002 |
| JP | 2003-81694 A | 3/2003 |
| JP | 2004-138669 A | 5/2004 |
| JP | 2004-309789 A | 11/2004 |
| JP | 2005-148459 A | 6/2005 |
| JP | 2006-047421 A | 2/2006 |
| JP | 2008-292809 A | 12/2008 |
| JP | 2009223165 A * | 10/2009 |
| WO | 2005/062114 A1 | 7/2005 |
| WO | 2009/019973 A1 | 2/2009 |

OTHER PUBLICATIONS

Japanese Office Action issued on Oct. 17, 2012, in a counterpart Japanese patent application No. 2009-086040.
Response (including the remarks and the amendment) to the Office Action listed Non-Patent Literature document No. 1 above.

* cited by examiner

*Primary Examiner* — James Phan
(74) *Attorney, Agent, or Firm* — Chen Yoshimura LLP

(57) ABSTRACT

An actuator device for optical deflector includes a base for mounting an optical deflector deflecting a light beam from a light source, at least one piezoelectric actuator translating and vibrating said base; and a supporting body supporting said piezoelectric actuator.

13 Claims, 12 Drawing Sheets

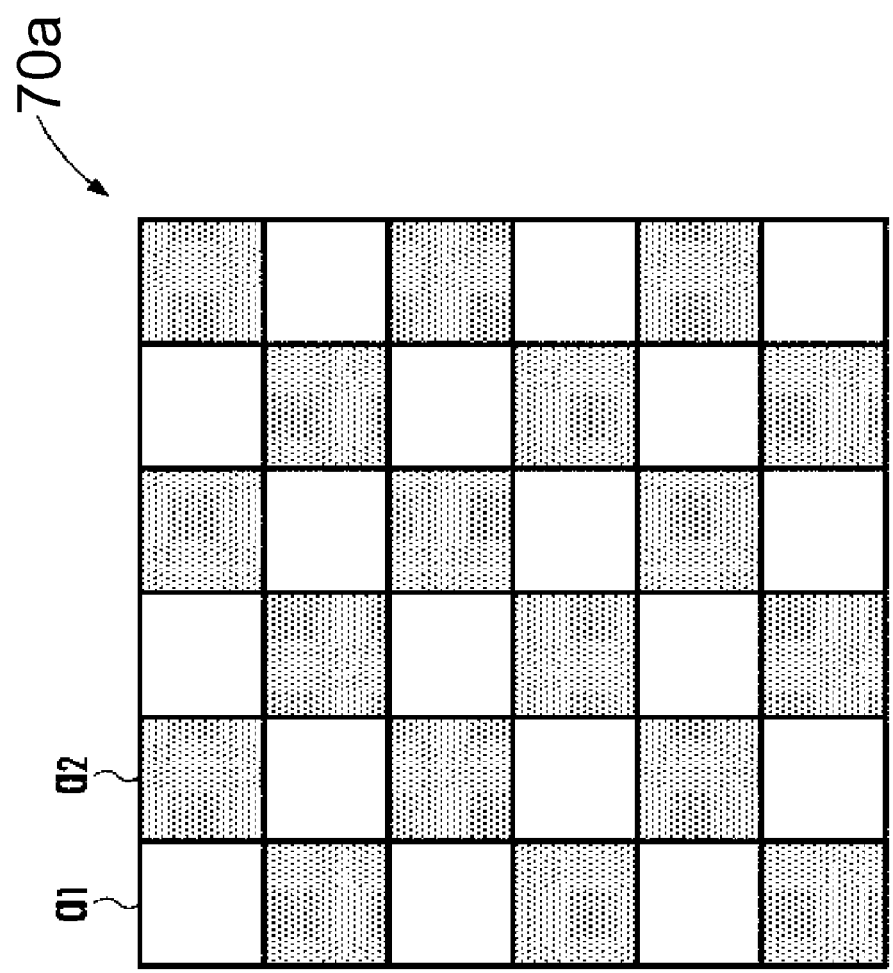

ACTUATOR DEVICE FOR OPTICAL DEFLECTOR

This application hereby incorporates by reference U.S. Pat. Nos. 7,605,965 and 7,605,966, both issued on Oct. 20, 2009, in their entireties.

BACKGROUND OF THE INVENTION

1. Field of the Invention

The present invention relates to an actuator device for optical deflector, on which an optical deflector for deflecting and scanning a light beam such as a laser beam is mounted.

2. Description of the Related Art

Recently, as one form of an image display device, a projection display has been proposed in which a light beam from a light source is deflected by an optical deflector and is projected onto a screen on which an image is displayed. For the optical deflector, for example, an optical deflector in which a mirror, a piezoelectric actuator and other mechanism elements are integrally formed on a semiconductor substrate has been proposed as a MEMS (micro electro mechanical systems) device using semiconductor processes or micro machine technology (see Patent Document 1).

In this optical deflector, one end of a piezoelectric actuator is linked to and supported by a frame part (support), and a torque, which is generated by the piezoelectric actuator, is transmitted to a torsion bar (elastic beam) that is connected to other end of the piezoelectric actuator, thereby rotationally driving a mirror attached to the end of the torsion bar. Advantages of such an optical deflector include its small size, simple structure, and a large driving force that can be provided.

For the aforementioned projection display, a technology has been proposed which uses a semiconductor laser or other laser beam sources as a light source, which, compared to a lamp, has a longer life as a light source, enables higher efficiency of energy use, and realizes higher purity of three primary colors of light. However, when using a laser beam source as a light source, there is a problem in that speckle noise (granular interference pattern) is generated, resulting in the deterioration of the quality of an image.

Speckle noise is a phenomenon that occurs when a coherent light having a constant phase from a laser beam source is scattered by a random phase plane (object plane), resulting in an interference of a disturbed wave front from adjacent regions of the object plane on an observation plane. This phenomenon appears on the observation plane as a granular intensity distribution. According to the projection display using a laser beam source, the observer is likely to recognize the deterioration of the quality of images when such speckle noise occurs between a screen as an object plane and an observer's eye (retina) as an observation plane. Therefore, various technologies have been proposed to reduce speckle noise (see Patent Documents 2 and 3, for example).

In the image display device described in Patent Document 2, speckle noise is reduced by a polarization distribution converting method, which spatially changes a polarization status of an incident laser beam. Specifically, this image display device displays an image using light which is emitted from a light source and is modulated by a spatial light modulator, and thereby converts the spatial polarization distribution of light emitted from the light source by using the polarization distribution converting means so that the polarization direction of incident lights entering adjacent pixels of the spatial light modulator is orthogonal to each other. Since orthogonal polarized lights do not interfere with each other, speckle noise in the displayed image, which is caused by the interference between the regions corresponding to adjacent pixels of the spatial light modulator, can be suppressed.

Further, in the image display device described in Patent Document 3, the polarization state of an incident laser beam is not changed; instead, an optical component which generates a very small difference in an optical path (to the extent that the image is not influenced; that is, the optical path differences are distributed to the extent that diffraction angles are small enough) is disposed, and by vibrating or rotating the optical component using a drive means so that the distribution of the optical path differences varies over time, generated speckle patterns are combined and averaged, thereby reducing speckle noise that can be observable on the screen.

Patent Document 1: Laid-open Japanese Patent Application No. 2005-148459

Patent Document 2: Laid-open Japanese Patent Application No. 2002-62582

Patent Document 3: Laid-open Japanese Patent Application No. 2004-138669

However, according to the devices described in Patent Documents 2 and 3, an addition of an optical element and/or a drive mechanism to the optical system is required, separately from an optical deflector, to reduce speckle noise. In other words, according to the technique described in Patent Document 2, a polarization distribution conversion means is required, and a laser beam diameter also needs to be expanded beyond the size of the polarization element of the polarization distribution conversion means, thereby requiring an additional lens or enlarging the size of the optical system.

Furthermore, according to the technique described in Patent Document 3, an optical component to change the optical path length and also a drive mechanism to vibrate or rotate the optical component need to be installed. Thus, in the technology described in Patent Documents 2 and 3, problems such as an increase of the number of components, an increase of size as a system, an increase of power consumption, an increase of noise, a complicated optical alignment, and so forth have been found.

SUMMARY OF INVENTION

To solve the aforementioned problems, the present invention aims to provide an actuator device for optical deflector, which has a small and simple configuration and is capable of reducing speckle noise which generates when a light beam from a light source such as laser beam source is scanned to display an image.

In one aspect, an actuator device for optical deflector of the present invention features a base on which an optical deflector deflecting light from a light source is mounted, at least one piezoelectric actuator to translate and vibrate the above-mentioned base, and a support to support the above-mentioned piezoelectric actuator.

According to the actuator device for optical deflector of the present invention, a piezoelectric actuator supported by a support translates and vibrates a base on which an optical deflector deflecting light from a light source is mounted. The optical deflector is capable of deflecting light by reflecting light from a light source. The piezoelectric actuator, by translating and vibrating the base on which this optical deflector is mounted, creates a very small optical path difference in the light reflected by the optical deflector, combines and averages speckle patterns, and projects it onto a screen, thereby reducing coherence between adjacent pixels of an image on a screen onto which the light is projected. In this way, speckle noise, which is generated when light from a light source is scanned to display an image, can be reduced.

Therefore, according to the present invention, it is possible to reduce speckle noise, which is generated when light from a light source such as a laser beam source is scanned to display an image, by a small and simple structure using an piezoelectric actuator without installing an optical element and its drive mechanism on an optical path.

In the present invention, it is preferred that a piezoelectric actuator includes a plurality of piezoelectric cantilevers which exhibit a bending deformation when drive voltage is applied and also that these cantilevers are connected and bent back and forth in an accordion manner.

According to this aspect, a plurality of piezoelectric cantilevers are connected and folded like an accordion. Therefore, when a drive voltage is applied to the piezoelectric cantilevers and each of them exhibits a bending deformation, a piezoelectric actuator as a whole, which includes a plurality of piezoelectric cantilevers, performs an operation in which the bending deformation of each piezoelectric cantilever is superimposed, thereby making it possible to translate and vibrate a base on which an optical deflector is mounted.

In the aforementioned aspect of the invention, it is preferred that each piezoelectric cantilever has at least one pair of electrodes in its longitudinal direction, and that a voltage is applied so that the electrical polarity of each opposing electrode of adjacent piezoelectric cantilevers is reversed or the phase of the alternating-current voltage does not match to these opposing electrodes.

According to this aspect, when a voltage is applied, an S-shaped deformation occurs to a piezoelectric cantilever due to shear force. As a result, a piezoelectric actuator as a whole performs an operation in which the S-shaped deformation of each piezoelectric cantilever is combined, thereby making it possible to translate and vibrate a base on which an optical deflector is mounted.

Furthermore, in the above-mentioned aspect, it is preferred that an alternating-current voltage is applied to adjacent piezoelectric cantilevers to create a reversed phase.

According to this aspect, in at least one pair of multiple electrodes that are disposed in the longitudinal direction of the piezoelectric cantilevers composing the piezoelectric actuator, an alternating-current voltage is applied to opposing electrodes to reverse their phase. As a result, the polarity of opposing electrodes is switched over, and each piezoelectric cantilever can be bent and deformed into an S-shape.

In another aspect, it is preferred that an actuator device for optical deflector of the present invention is equipped with an optical window through which incident light to the optical deflector mounted on the base and a reflected light from the optical deflector transmit, and also that the aforementioned optical window generates an optical path difference in a transmitting light within its plane.

According to this aspect, a reflected light from an optical deflector mounted on a base to be translated and vibrated by a piezoelectric actuator transmits through various positions of an optical window, thereby varying the distribution of the optical path differences. As a result, due to the optical path differences generated by translation and vibration of the optical deflector and also due to the variation of the distribution of the optical path differences, coherence between adjacent pixels of an image on a screen onto which the scanned light is projected can be further reduced. Additionally, by constructing an optical window so as to generate an optical path difference, there is no need to provide a separate optical element or performing an optical alignment therefor, and a compact optical system can be maintained.

In another aspect, it is preferred that an actuator device for the optical deflector of the present invention is equipped with an optical window that transmits the incident light to the optical deflector mounted on the base and the reflected light from the optical deflector, and that the above-mentioned optical window modulates the polarization state of transmitting lights within its plane.

According to this aspect, the reflected light from an optical deflector mounted on a base which is translated and vibrated by a piezoelectric actuator transmits through the optical window and is modulated. Due to the translation and vibration of the optical deflector and also the modulation of light, coherence between adjacent pixels of an image on a screen onto which scanned light is projected can be further reduced. Additionally, by constructing an optical window so as to modulate the polarization state, there is no need to provide a separate optical element or perform an optical alignment therefor, and a compact optical system can be maintained.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 11 is a drawing to illustrate one example of an optical window shown in FIG. 7.

DESCRIPTION OF THE PREFERRED EMBODIMENTS

First Embodiment

With reference to FIGS. 1 to 6L, a first embodiment of the present invention is described.

Figure 1:
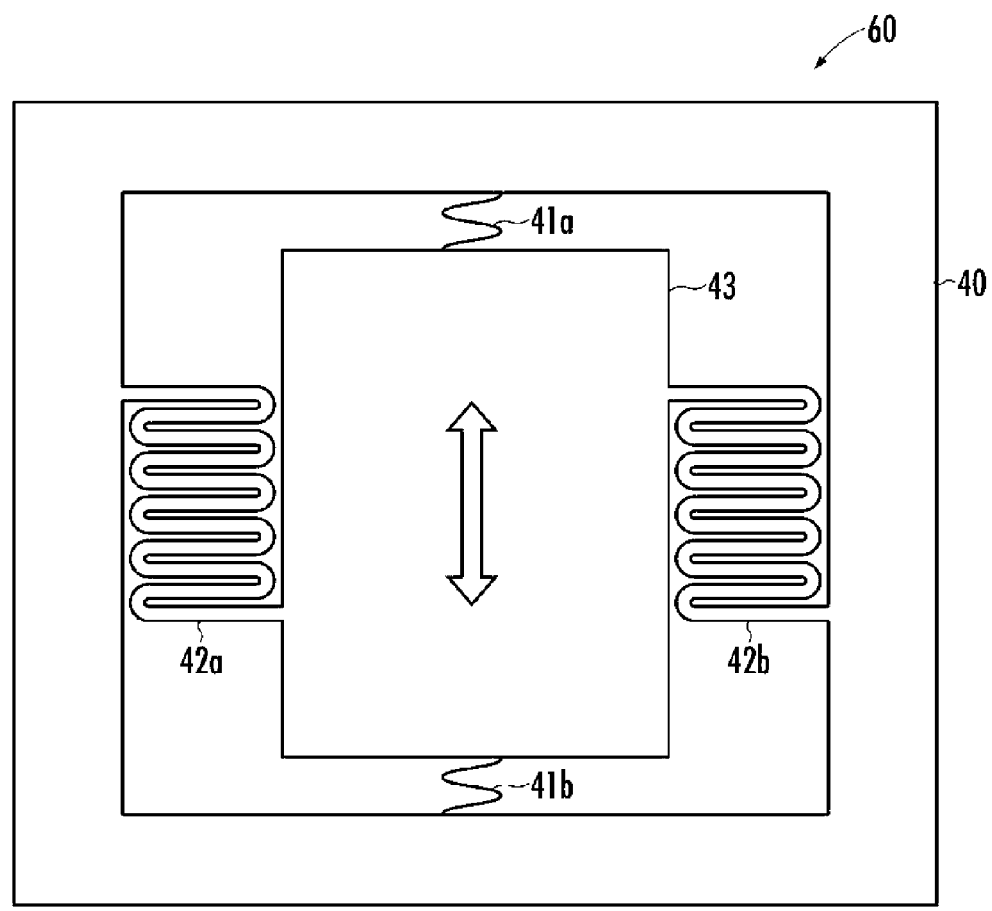
FIG. 1 is a plan view of an actuator device for optical deflector according to an embodiment of the present invention.

As shown in FIG. 1, an actuator device for optical deflector 60 of the present embodiment is equipped with a base 43 on which an optical deflector deflecting light from a light source is mounted, one pair of dampers 41a, 41b that support the base 43, piezoelectric actuators 42a, 42b that drive (translate and vibrate) the base 43 as described later, and a supporting body 40 that supports the dampers 41a, 41b and the piezoelectric actuators 42a, 42b.

The supporting body 40, the dampers 41a, 41b, the piezoelectric actuators 42a, 42b, and the base 43 are integrally formed, for example, by forming a thin film of lead zirconate titanate (PZT), which is a piezoelectric body, on a semiconductor substrate using an ion plating technique or sputtering, followed by performing dry etching on the PZT thin film and the silicon structure of the semiconductor substrate using a semiconductor planar process and a MEMS process.

The base 43 is rectangular in its form, of which two sides that face each other (shorter sides in FIG. 1) are connected to the respective leading ends of a pair of the dampers 41a, 41b, respectively, and other two facing sides (longer sides in FIG. 1) are connected to the respective leading ends of a pair of the piezoelectric actuators 42a, 42b, respectively.

Furthermore, each of the anchor ends of the dampers 41a, 41b and the piezoelectric actuators 42a, 42b is connected to the supporting body 40, which is formed in a frame that encloses the dampers 41a, 41b and also the piezoelectric actuators 42a, 42b. In other words, the base 43 is supported such that two facing sides of its four sides are connected to the supporting body 40 through the dampers 41a, 41b, while the other two sides are connected to the supporting body 40 through the piezoelectric actuators 42a, 42b.

Therefore, the base 43 is supported inside the supporting body 40 while retaining its mobility, mechanical strength, and the stability during a translational drive (first translational drive) by the piezoelectric actuators 42a, 42b described later.

The base 43 is fabricated by processing a semiconductor substrate. Therefore, the surface of the base 43 on which an optical deflector is secured is extremely flat, thereby making it also easy to secure an optical deflector fabricated by processing the semiconductor substrate. To secure the base 43 and the optical deflector, an adhesive resin, Au—Sn eutectic bonding, Au—Au solid phase diffusion bonding, solder joint, bump bonding, or any other bonding system that is industrially available can be used. Also, the bonding of the base 43 and the optical deflector can be done at the time of processing the semiconductor substrate.

Figure 2A:
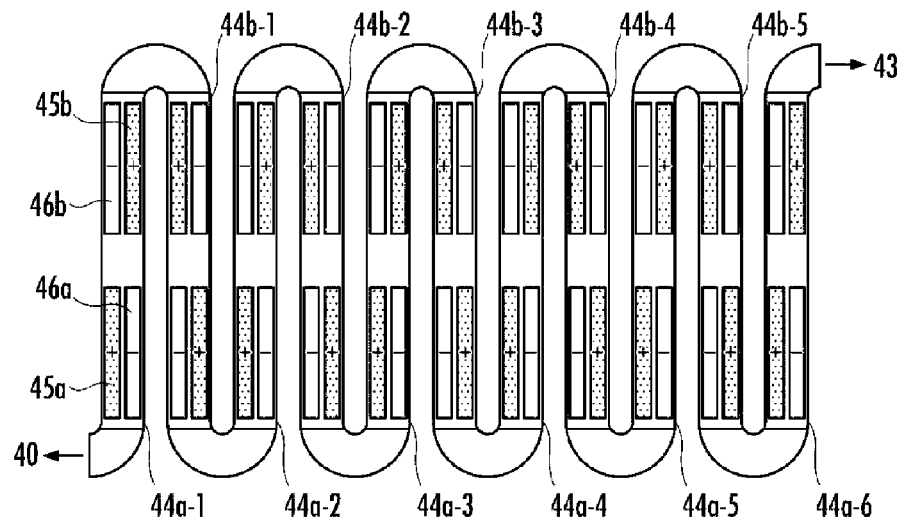
FIGS. 2A-2B are schematic views of a piezoelectric actuator used for an actuator device for optical deflector according to an embodiment of the invention, with FIG. 2A showing its inactive status and FIG. 2B showing its active status.

As shown in FIG. 2A, the piezoelectric actuator 42a is composed of a plurality (11 pieces shown in the drawing) of interconnected piezoelectric cantilevers 44a (indicated as 44a-1 to 44a-6, respectively) and 44b (indicated as 44b-1 to 44b-5, respectively). In more detail, counting from the anchor end of the piezoelectric actuator 42a connected to the supporting body 40, six odd-numbered piezoelectric cantilevers 44a and five even-numbered piezoelectric cantilevers 44a are folded and connected in an accordion shape.

The piezoelectric cantilevers 44a, 44b are formed in a band plate shape, are the same in size in their length direction, and are disposed side by side with their both ends aligned to each other so that the space between them allows a translational drive.

Because all of the piezoelectric cantilevers 44a-1 to 44a-6 have the same configuration, respectively, a first cantilever 44a-1 is described below.

Figure 3A:
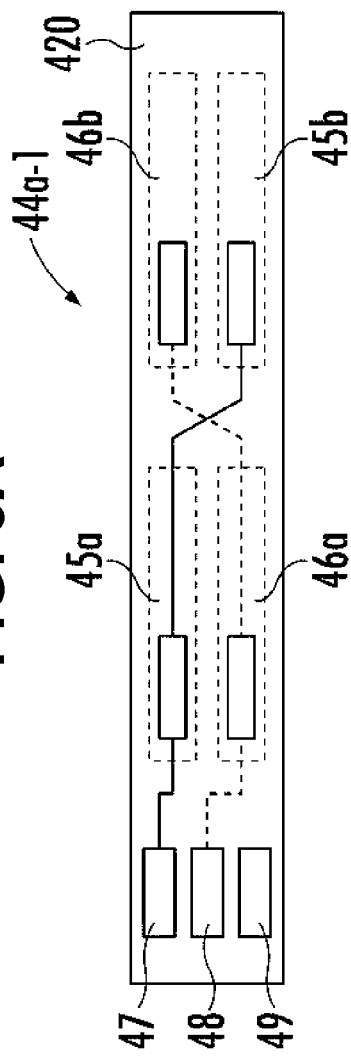
FIG. 3A is a plan view of a piezoelectric cantilever that composes a piezoelectric actuator.
Figure 3B:
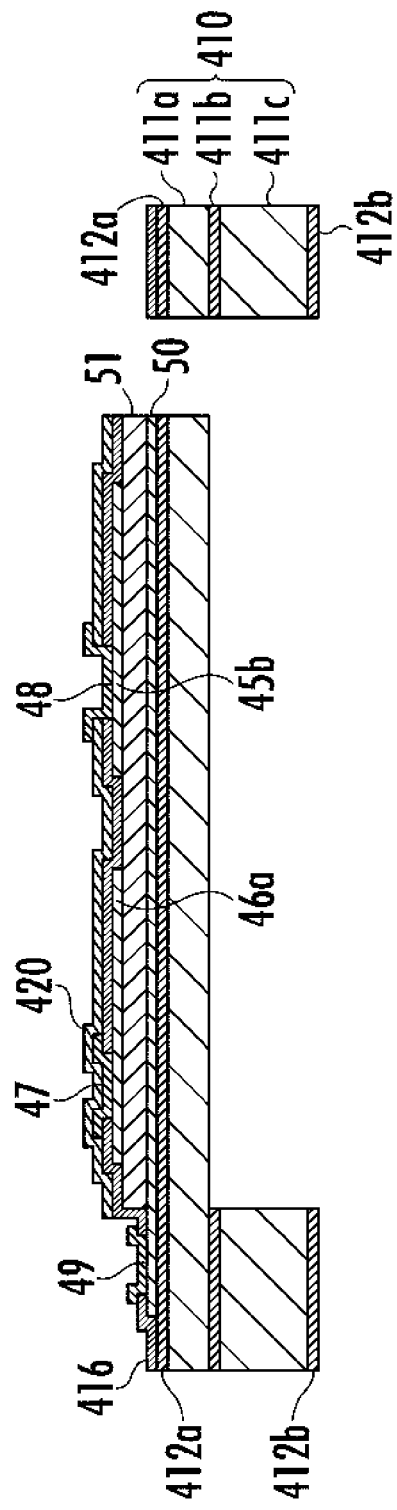
FIG. 3B is its cross-sectional view.

As shown in FIGS. 3A and 3B, the piezoelectric cantilever 44a-1 is formed from a semiconductor substrate (for example, a silicon substrate such as a single crystal silicon substrate or SOI (Silicon On Insulator)), whose main structure is made of a thin SOI layer whose thickness is about several tens μm.

In more detail, in the example shown in the figures, the piezoelectric cantilever 44a is equipped with, as main components to realize its functions, four independent upper electrodes 45a, 45b, 46a, and 46b, a lower electrode 50, an upper electrode wiring 47 connecting the upper electrode 45a and the upper electrode 45b, and an upper electrode wiring 48 connecting the upper electrode 46a and the upper electrode 46b.

A pair of the upper electrode 45a and the upper electrode 46b and a pair of the upper electrode 46a and the upper electrode 45b are disposed side by side in the transverse direction of the piezoelectric cantilever 44a-1. A pair of the upper electrode 45a and the upper electrode 46a and a pair of the upper electrode 46b and the upper electrode 45b are disposed side by side in the longitudinal direction of the piezoelectric cantilever 44a-1.

As described above, the upper electrode wiring 47 connects the upper electrode 45a and the upper electrode 45b, while the upper electrode wiring 48 connects the upper electrode 46a and the upper electrode 46b. Therefore, the piezoelectric cantilever 44a-1 has a configuration in which among the four upper electrodes 45a, 45b, 46a, 46b disposed side by side in pairs, the two electrodes disposed diagonally (in the drawing, a pair of the upper electrode 45a and 45b and a pair of the upper 46a and 46b) assume the same polarity.

In this embodiment, the piezoelectric cantilever 44a-1 is fabricated by processing an SOI substrate 410, which is composed of an active layer 411a, an interlayer oxide film layer 411b, and a handling layer 411c. This is explained later in more detail in a section concerning a manufacturing process of the piezoelectric actuator 42a, 42b (FIGS. 4A-6L). Put briefly, for the piezoelectric cantilever 44a-1, there are formed on the surface of the SOI substrate 410 (on the side of the active layer 411a) a thermally-oxidized silicon film 412a, a lower electrode layer 413, a piezoelectric layer 414, an upper electrode layer 415, a first interlayer dielectric film 416, and a second interlayer dielectric film 420. They are processed to form a lower electrode 50, a piezoelectric body 51, upper electrodes 45a, 45b, 46a, 46b, a lower electrode wiring 49, and upper electrode wirings 47, 48.

The piezoelectric cantilevers 44b-1 to 44b-5 have the same configuration as the piezoelectric cantilever 44a, except the wiring of the upper electrode wirings 47, 48. In the piezoelectric cantilever 44a, the upper electrode 45a and the upper electrode 45b are connected by the upper electrode wiring 47, and the upper electrode 46a and the upper electrode 46b are connected by the upper electrode wiring 48. In contrast, in the piezoelectric cantilever 44b, the upper electrode 46a and the upper electrode 46b are connected by the upper electrode wiring 47, and the upper electrode 45a and the upper electrode 45b are connected by the upper electrode wiring 48.

As shown in FIG. 2, the piezoelectric cantilevers 44a, 44b, which make up the piezoelectric actuator 42, are fabricated by processing the SOI substrate 410 whose thickness is about several tens μm. In other words, this is a configuration in which a thin silicon is repeatedly folded and connected, and therefore the configuration itself possesses a function as an elastic beam. Because of this, a translational displacement of about 100 μm, which is necessary to remove speckle patterns, can be obtained without installing a suspension connecting to a movable plate (without utilizing mechanical resonance phenomenon).

Specifically, as shown in FIG. 2A, the piezoelectric actuator 42 includes the piezoelectric cantilevers 44a, 44b, each of which possess four upper electrodes 45a, 45b, 46a, 46b. In more detail, in the piezoelectric actuator 42, the piezoelectric cantilevers are connected in order starting from the piezoelectric cantilever 44a-1, the piezoelectric cantilever 44b-1, the piezoelectric cantilever 44a-2, the piezoelectric cantilever 44a-3, . . . , the piezoelectric cantilever 44b-5, and the piezoelectric cantilever 44a-6.

Also, in the piezoelectric cantilever 44a, the upper electrode 45a and the upper electrode 45b are connected by the upper electrode wiring 47, and the upper electrode 46a and the upper electrode 46b are connected by the upper electrode wiring 48. Also, in the piezoelectric cantilever 44b, the upper electrode 46a and the upper electrode 46b are connected by the upper electrode wiring 47, and the upper electrode 45a and the upper electrode 45b are connected by the upper electrode wiring 48.

Therefore, when a voltage that generates a reverse polarity in the upper electrode wiring 47 and the upper electrode wiring 48 is applied, or when a bias voltage that generates a reverse phase with a 180-degree phase shift due to an alternating-current wave form is applied, the upper electrodes 45a, 45b of the piezoelectric cantilever 44a and the upper electrodes 46a, 46b of the piezoelectric cantilever 44b exhibit the same polarity (shown as positive polarity in the figure); the upper electrodes 46a and 46b of the piezoelectric cantilever 44a and the upper electrodes 45a and 45b of the piezoelectric cantilever 44b exhibit the reverse polarity (shown as negative polarity in the drawing) as compared to the upper electrodes 45a, 45b of the piezoelectric cantilever 44a and the upper electrodes 46a, 46b of the piezoelectric cantilever 44b; and all of the adjacent upper electrode pairs (45a, 46a), (46b, 45b) exhibit respective polarities reverse to each other.

Figure 2B:
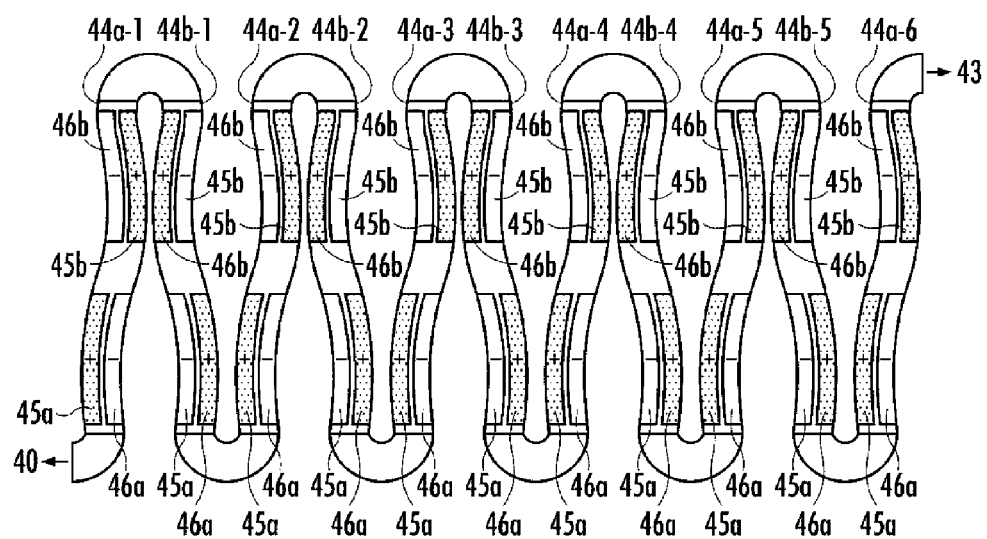

As a result, as shown in FIG. 2B, a bending deformation occurs within the plane of the piezoelectric cantilevers 44a, 44b. In other words, an S-shaped deformation due to shear force occurs to the piezoelectric cantilevers 44a, 44b. Because the piezoelectric cantilevers 44a, 44b of the piezoelectric actuator 42 are connected, a bending change is augmented for each one of the piezoelectric cantilevers 44a, 44b. As a result, it becomes possible that the piezoelectric actuator 42 as a whole gains a translational displacement of about 100 µm.

Here, the lower electrode wiring 49, the upper electrode wiring 47, and the upper electrode wiring 48 of each of the piezoelectric cantilevers 44a, 44b are connected to a feed pad for the lower electrode wiring 49 (not shown in the drawing), a feed pad for the upper electrode wiring 47 (not shown in the drawing), and to a feed pad for the upper electrode wiring 48 (not shown in the drawing), respectively, all of which are installed in the supporting body 40.

Therefore, when a voltage that generates a reverse polarity in the feed pad for the upper electrode wiring 47 and the feed pad for the upper electrode wiring 48 is applied, or when a bias voltage that generates a reverse phase in these feed pads with a 180-degree phase shift due to an alternating-current wave form is applied, the upper electrodes 45a, 45b exhibit the same polarity (shown as positive polarity in the drawing); the upper electrodes 46a, 46b exhibit the reverse polarity relative to the upper electrodes 45a, 45b (shown as negative polarity in the drawing); and all of the adjacent upper electrodes 45a, 45b, 46a, 46b exhibit the reverse polarity.

Manufacturing Process

FIGS. 4A to 6L show a manufacturing process of a piezoelectric actuator 42a of an actuator for optical deflector 60 of the present embodiment. These drawings schematically show cross sections of the piezoelectric actuator.

Figure 4A:
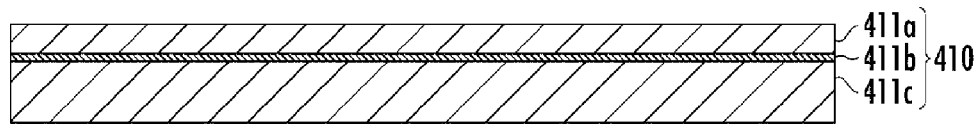
FIGS. 4A-4D illustrate a manufacturing process of the piezoelectric actuator shown in FIG. 1.

As shown in FIG. 4A, an SOI substrate 410 includes an active layer 411a, an interlayer oxide film layer 411b, and a handling layer 411c, and is used as a semiconductor substrate that forms the piezoelectric actuator 42.

Figure 4B:
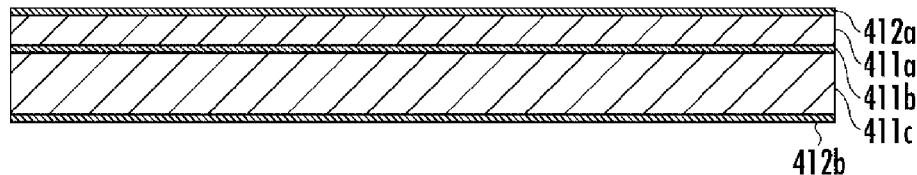

As shown in FIG. 4B, thermally-oxidized silicon films 412a, 412b are formed by oxidizing the top surface (the side of the active layer 411a) and the bottom surface (the side of the handling layer 411c) of the SOI substrate 410, respectively, in a thermal oxidation furnace (a diffusion furnace) (thermally-oxidized film forming step). The thickness of the thermally-oxidized silicon films 412a, 412b is set to about 0.1-1 µm, for example.

Figure 4C:
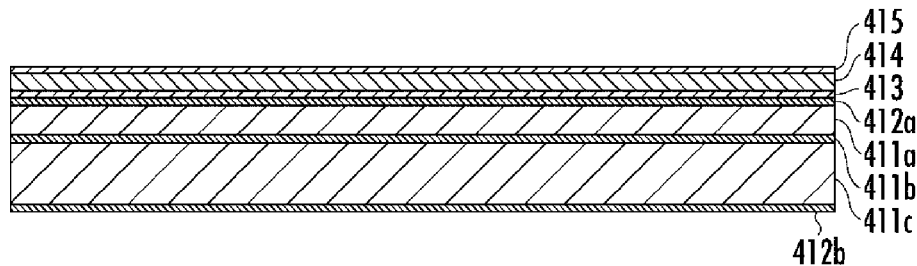

Next, as shown in FIG. 4C, a lower electrode layer 413, a piezoelectric layer 414, and an upper electrode layer 415 are formed in this order over the top surface (the side of the active layer 411a) of the SOI substrate 410.

First, by the following lower electrode layer forming step, the lower electrode layer 413, which is made of two layers of thin metal films, is formed on the thermally-oxidized silicon film 412a located on the side of the active layer 411a of the SOI substrate 410. For the material of the lower electrode layer 413, titanium (Ti) is used for the first thin metal film layer (the bottom layer) and platinum (Pt) is used for the second thin metal film layer (the top layer) in this example. Each of the thin metal film is formed, for example, by sputtering, an electron beam evaporation technique, or the like. The thickness of the thin metal films is set, for example, to about 30-100 nm for Ti of the first layer and about 100-300 nm for Pt of the second layer.

Next, by the following piezoelectric layer forming step, the piezoelectric layer 414, which is a single layer of a piezoelectric film, is formed on the top of the lower electrode layer 413. For the material for the piezoelectric layer 414, lead zirconate titanate (PZT), which is a piezoelectric material, is used in this example. The thickness of the piezoelectric film is set to about 1-10 µm, for example. The piezoelectric film is formed, for example, by an ion plating technique using a reactive arc discharge.

Specifically, with regard to the ion plating technique using a reactive arc discharge, a technique described in the following Japanese patent application documents by the present applicants may be used: Laid-open Japanese Patent Application No. 2001-234331, Laid-open Japanese Patent Application No. 2002-177765, and Laid-open Japanese Patent Application No. 2003-81694, all of which are hereby incorporated by reference in their entireties.

In this ion plating technique using the reactive arc discharge, a metal material is thermally evaporated in a high density oxygen plasma generated by a plasma gun in a vacuum chamber, and the resultant metal vapor reacts with oxygen in the vacuum chamber or over the semiconductor substrate, thereby forming a piezoelectric film on the semiconductor substrate.

By using this technique, the piezoelectric film can be formed at a high speed even at a relatively low film forming temperature. Especially, in the ion plating technique using the reactive arc discharge, a seed layer may be formed by the CSD (Chemical Solution Deposition) technique, for example, as a base on which a piezoelectric film with high quality piezoelectric properties can be formed.

Alternatively, the piezoelectric film can also be formed by sputtering, a sol-gel technique, or the like. However, a relatively thick piezoelectric film with good piezoelectric properties (as good piezoelectric properties as those of a bulk piezoelectric body) can be formed by the ion plating technique using the reactive arc discharge.

Next, by the following upper electrode layer forming step, the upper electrode layer 415, which is made of one layer of a thin metal film, is formed on the top of the piezoelectric layer 414. For the material for the upper electrode layer 415, Pt or Au may be used for example. The upper electrode layer 415 is formed, for example, by sputtering, an electron beam evaporation technique, or the like. The thickness of the upper electrode layer 415 is set to about 10-200 nm, for example.

Figure 4D:
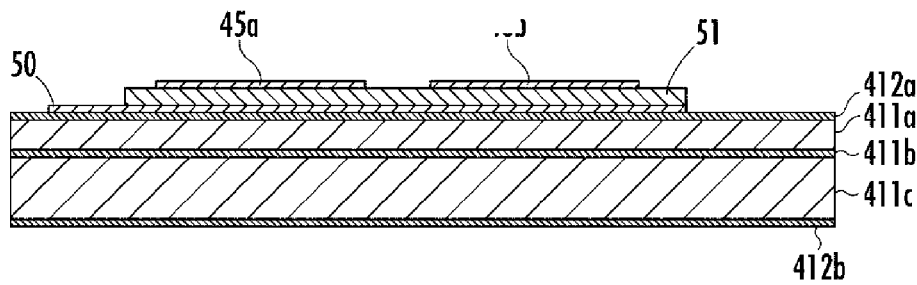

Next, as shown in FIG. 4D, by the following patterning step, the upper electrode layer 415, the piezoelectric layer 414, and the lower electrode layer 413 are patterned to form the upper electrode 45a, 45b, 46a, 46b, the piezoelectric body 51, and the lower electrode 50, respectively.

Specifically, first, a resist material is patterned on the upper electrode layer 415 by photolithography. Next, using the patterned resist as a mask, dry etching is performed on the upper electrode layer 415 and the piezoelectric layer 414 by an RIE (Reactive Ion Etching) apparatus.

In this process, the upper electrodes 45a, 45b, 46a, 46b, and the piezoelectric body 51 are formed. In other words, the upper electrode layer 415 is processed to form the upper electrodes 45a, 45b, 46a, 46b, and the piezoelectric layer 414 is processed to form the piezoelectric body 51.

Then, a resist material is patterned on the lower electrode layer 413 by photolithography. Next, using the patterned resist material as a mask, dry etching is performed on the lower electrode layer 413 by RIE, thereby forming the lower electrode 50. That is, the lower electrode 50 is formed by processing the lower electrode layer 413.

Next, as shown in FIGS. 5E-5H and FIGS. 6I, 6J, the lower electrode wiring 49 and the upper electrode wirings 47, 48 are formed in a wiring forming step.

Figure 5E:
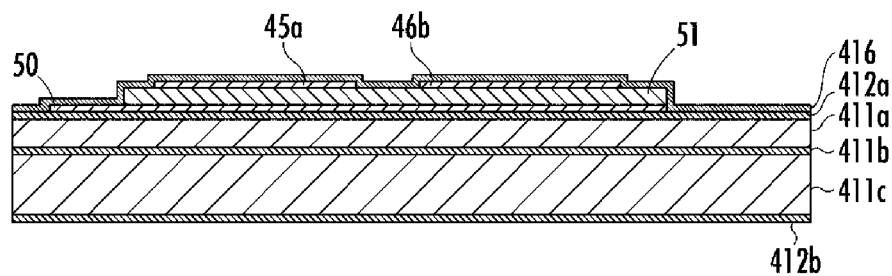
FIGS. 5E-5H illustrate a manufacturing process continued from FIGS. 4A-4D.

First, as shown in FIG. 5E, a first interlayer dielectric film 416 is formed over the entire surface of the SOI substrate, which includes the piezoelectric layer 414 that forms the piezoelectric body 51 exposed partially after the upper electrode layer 415 thereon was removed by dry etching during the pattering step of the upper electrode 45a, 45b, 46a, 46b, and which also includes the thermally-oxidized silicon film 412a partially exposed after the lower electrode layer 413 thereon was removed by dry etching during the patterning step. For the first interlayer dielectric film 416, an $SiO_2$ film formed by a plasma CVD apparatus can be used, for example.

Figure 5F:
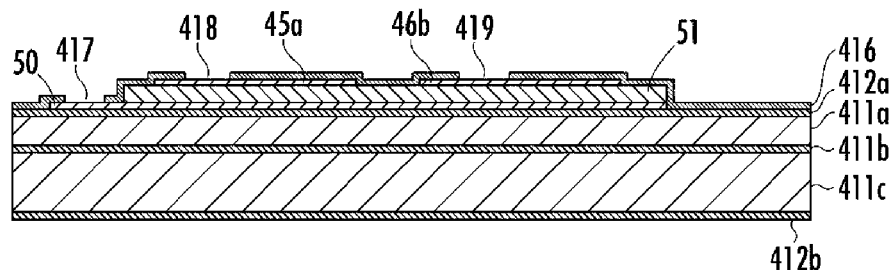

Next, as shown in FIG. 5F, a resist material is patterned on the first interlayer dielectric film 416 by photolithography. Using the patterned resist material as a mask, dry etching is performed on the first interlayer dielectric film 416 by RIE.

In this process, contact holes 417-419 are formed over the lower electrode 50 and over the upper electrodes 45a, 45b, 46a, 46b, respectively. In more detail, the contact hole 417 for the lower electrode wiring 49 is formed on the lower electrode 50; the contact hole 418 for the upper electrode wiring 47 is formed on the upper electrode 45a and the upper electrode 45b, respectively; and the contact hole 419 for the upper electrode wiring 48 is formed on the upper electrode 46a and the upper electrode 46b, respectively.

Figure 5G:
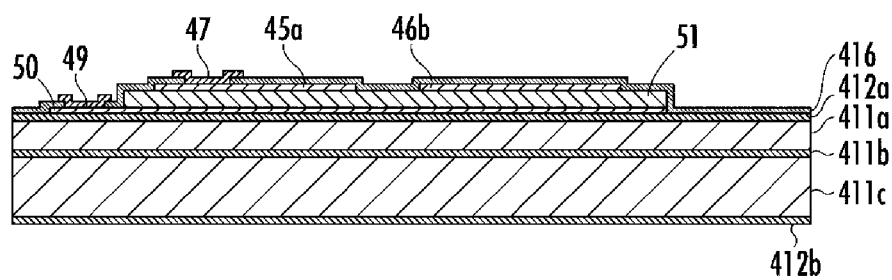

Next, as shown in FIG. 5G, the lower electrode wiring 49 and the upper electrode wiring 47 are formed by an aluminum wiring. As shown in FIG. 3A, the upper electrode wiring 47 connects the upper electrode 45a and the upper electrode 45b. For the aluminum wiring, an aluminum film is formed, for example, by sputtering, an electron beam evaporation technique, or the like.

Figure 5H:
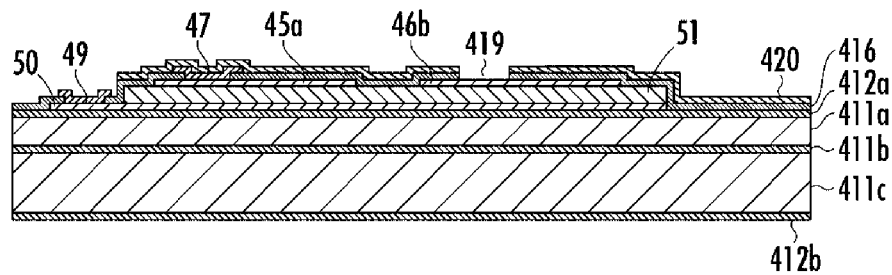

Next, as shown in FIG. 5H, a second interlayer dielectric film 420 is formed on the entire surface of the SOI substrate, and then a contact hole 419 is formed therein. In more detail, in the same way as in the case of the first interlayer dielectric film 416, the second interlayer dielectric film 420 ($SiO_2$ film) is formed by a plasma CVD apparatus, for example.

Next, a resist material is patterned on the second interlayer dielectric film 420 by photolithography. Then, using the patterned resist material as a mask, dry etching is performed on the second interlayer dielectric film 420 by RIE, thereby exposing the lower electrode wiring 49 and forming the contact hole 419.

Figure 6I:
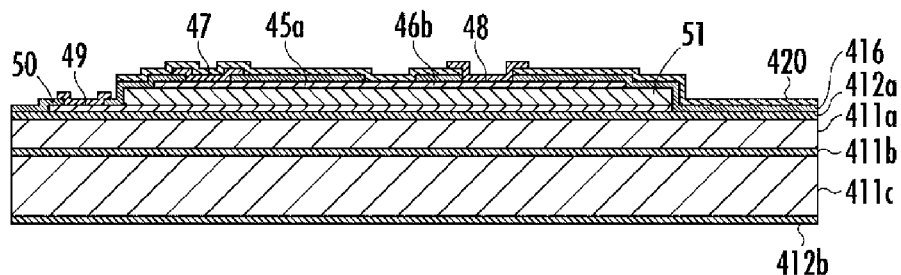
FIGS. 6I-6L illustrate a manufacturing process continued from FIGS. 5E-5H.

Referring to FIG. 6I, the upper electrode wiring 48 is formed by an aluminum wiring. As shown in FIG. 3A, the upper electrode wiring 48 connects the upper electrode 46a and the upper electrode 46b. For the aluminum wiring, an aluminum film is formed, for example, by sputtering, an electron beam evaporation technique, or the like.

Figure 6J:
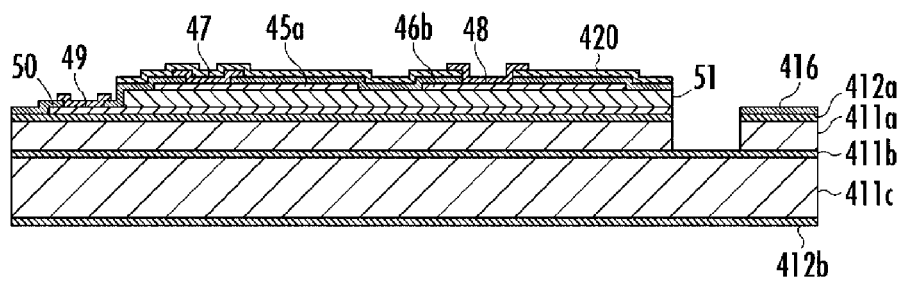
Figure 6K:
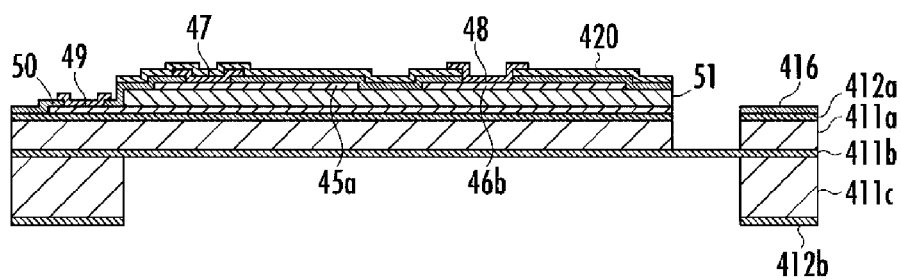
Figure 6L:
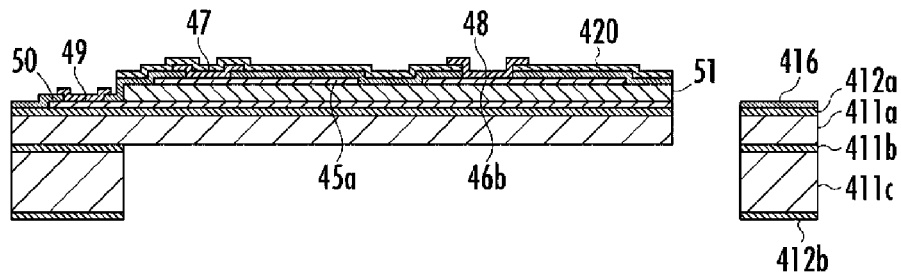

Referring to FIGS. 6J-6L, a piezoelectric actuator is formed by the following piezoelectric actuator forming step.

First, as shown in FIG. 6J, a patterning of the activity layer 411a (single crystal silicon) is processed. First, a resist material is patterned by photolithography, and using the patterned resist material as a mask, the second interlayer dielectric film 420, the first interlayer dielectric film 416, the thermally-oxidized silicon film 412a, and the silicon of the activity layer 411a are patterned by an ICP-RIE (Inductively Coupled Plasma Reactive Ion Etching) apparatus. Here, the ICP-RIE apparatus is a dry etching device used in micro-machine technology and can etch silicon vertically and deeply.

Next, as shown in FIG. 6K, the thermally-oxidized silicon film 412b is removed and the handling layer 411c is processed. In more detail, the entire upper surface of the SOI substrate 410 is protected by a thick film resist, and the thermally-oxidized silicon film 412b located on the bottom side of the SOI substrate on the side of the handling layer 411c is partially removed by buffered hydrofluoric (BHF). Then, by the ICP-RIE apparatus, dry etching is performed on the single crystal silicon of the handling layer 411c.

Referring to FIG. 6L, the interlayer oxide film layer 411b is removed by BHF. As a result, the back side of the supporting body of the piezoelectric cantilever is deeply etched and becomes hollow to form the piezoelectric actuator 42a.

Next, a manufacturing process of the base 43 is described. The manufacturing process of the base 43 is similar to that of the piezoelectric actuator 42a described above. A difference is found in the patterning process step shown in the FIG. 4D. In the manufacturing process for the movable base 43, all of the upper electrode layer 415, the piezoelectric layer 414, and the lower electrode layer 413 are removed by performing etching on the entire surface thereof. In other words, for the base 43, dry etching is performed on all of the upper electrode layer 415, the piezoelectric layer 414, and the lower electrode layer 413 by using a RIE (Reactive Ion Etching) apparatus to form a surface on which the optical deflector will be secured.

In the case that the optical deflector is affixed on the base 43 using adhesive resin, an interlayer dielectric film using an $SiO_2$ film is formed after all of the upper electrode layer 415, the piezoelectric layer 414, and the lower electrode layer 413 are removed.

Also, in the case that the optical deflector is affixed on the base 43 using Au—Sn eutectic bonding, Au—Au solid phase diffusion bonding, solder joint, or other metal-mediated bonding systems, films are formed by sputtering Ti, Ni, and Au in this order to form a metal pad necessary for securing the optical deflector on the base 43. The metal pad is formed separately from the formation of the aluminum wirings of the upper electrode wirings 47, 48 for the piezoelectric actuator 42a, 42b and the lower electrode wiring 49.

Next, a manufacturing process of the dampers 41a and 41b is described. The manufacturing process of the dampers 41a, 41b is also similar to that of the base 43 described above. For the dampers 41a, 41b too, in the patterning process step as shown in FIG. 4D, all of the upper electrode layer 415, the piezoelectric layer 414, and the lower electrode layer 413 are removed by performing etching on the entire surface of them in the same way as in the manufacturing process of the base 43. In the wiring forming step that follows, the dampers 41a, 41b are protected with a mask of a resist material.

As just described, the piezoelectric actuators 42a, 42b, the base 43, and the dampers 41a, 41b are manufactured by processing a semiconductor substrate, which makes it possible to integrally form them by using a semiconductor planar process and a MEMS process. As a result, the fabrication is simplified, and the miniaturization, mass-production, and the yield improvement also become possible.

Second Embodiment

With reference to FIGS. 7 to 11, a second embodiment of the present invention is described.

Figure 7:
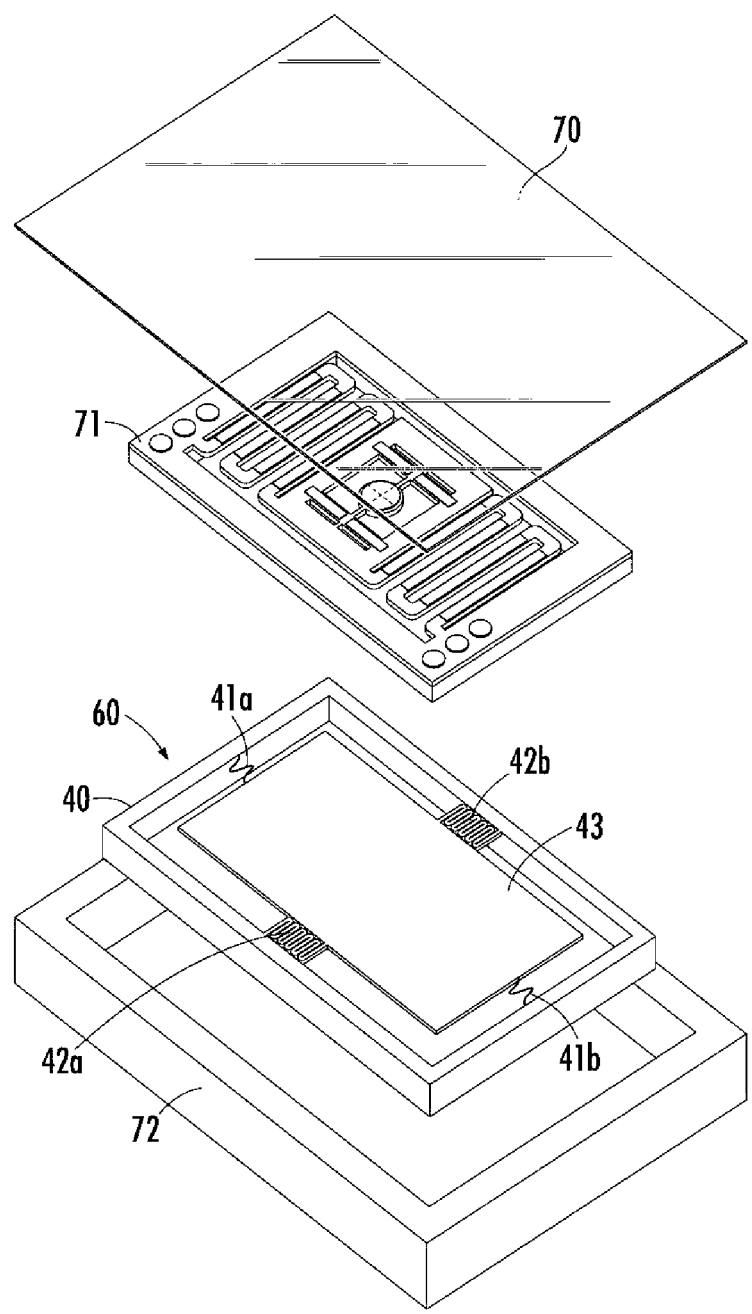
FIG. 7 illustrates a perspective view showing a configuration of a package in which an actuator device for optical deflector of an embodiment is mounted with an optical deflector.

As shown in FIG. 7, according to the present embodiment, an actuator device for optical deflector 60 is mounted on a package 72 by securing the optical deflector 71 on the base 43. On the top of the package 72, a transparent optical window 70 is formed to introduce incident light to a reflecting film 1b on the mirror plane of a mirror 1 of the optical deflector 71 shown in FIG. 8.

The optical deflector 71 may be secured on the base 43 using a bonding system, such as adhesive resin, Au—Sn eutectic bonding, Au—Au solid phase diffusion bonding, solder joint, bump bonding, or the like. In this example, it is secured on the base 43 of the actuator for optical deflector 60 using Au—Au solid phase diffusion bonding.

In this case, by sputtering Ti, Ni, and Au in this order, a film of each metal material is formed both on the bottom side of the optical deflector 71 and on the base 43 of the actuator 60 for optical deflector. Then, after they are processed into respective chips, a surface activation process by Ar plasma is carried out, and by aligning their position by a die bonder, the optical deflector 71 and the base 43 are heated at 200-300° C. to be bonded together.

The actuator 60 for optical deflector, on which the optical deflector 71 is secured, is mounted on the package 72 made of ceramic, or the like. Then, bonding wires for feeding power are connected to each of the electrode pads 12a-12f and 13a-13d of the optical deflector 71 and also to each of the feed pads that supply a voltage to the upper electrode wirings 47, 48 and the lower electrode wiring 49 of the actuator for optical deflector 60. Then, the package 72 is sealed by the optical window 70 both of which sides are coated with an AR (anti-reflection) film.

Figure 8:
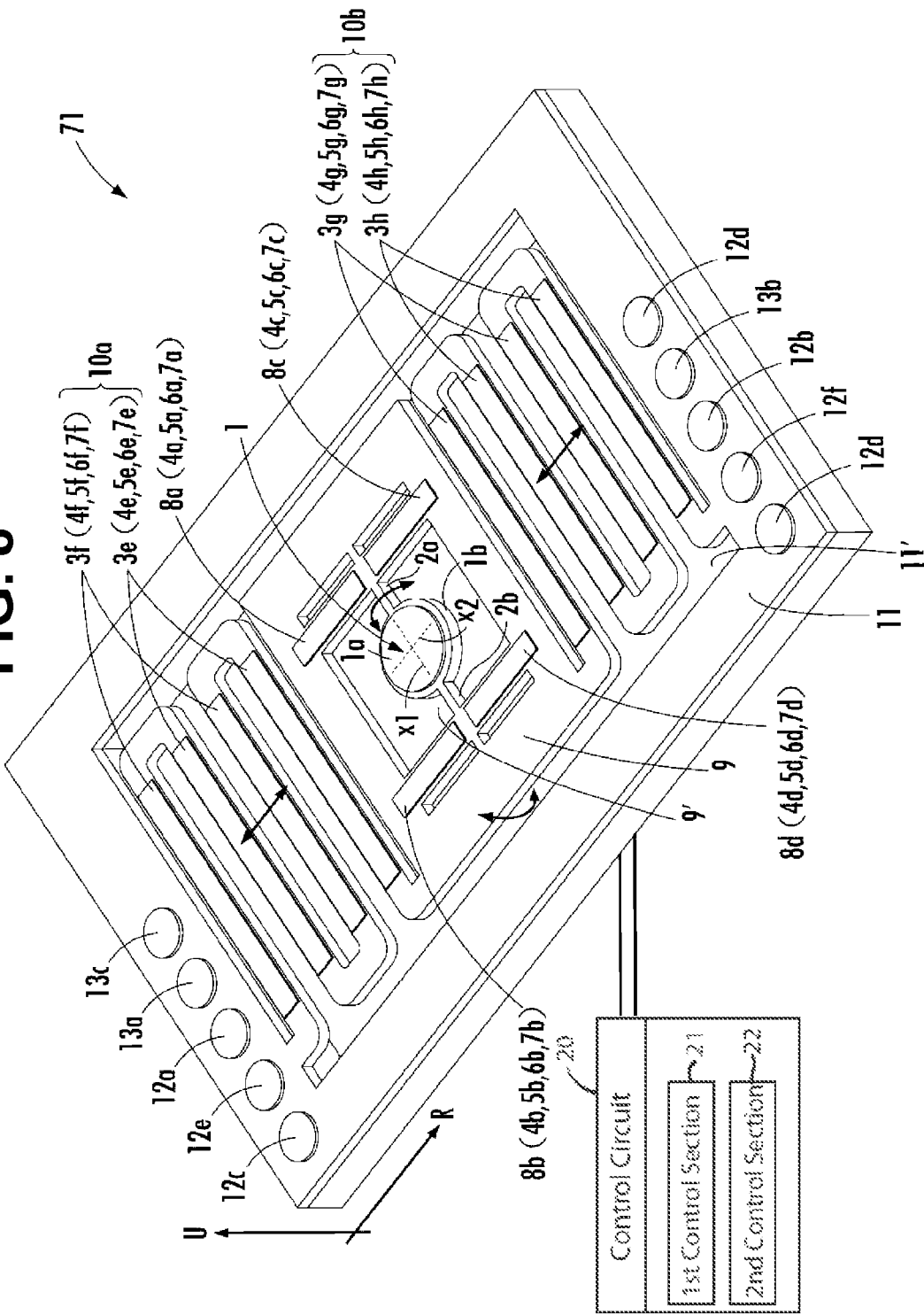
FIG. 8 is a perspective view showing a configuration of the optical deflector shown in FIG. 7.

As shown in FIG. 8, the optical deflector 71 includes: a mirror 1 that reflects incident light; torsion bars 2a, 2b that are connected to the mirror 1; two pairs of inner first piezoelectric actuators 8a-8d that drive the mirror 1 via the torsion bars 2a, 2b; a movable frame 9 that supports the first piezoelectric actuators 8a-8d; one pair of outer second piezoelectric actuators 10a, 10b that drive the movable frame 9; and a support 11 that supports the second piezoelectric actuators 10a, 10b.

As shown in FIG. 8, the mirror 1 is circle in its shape in this example, and from both ends of its diameter segment, the above-mentioned pair of the torsion bars 2a, 2b extend outwardly. The leading end of the torsion bar 2a is connected to the mirror 1, and the anchor end thereof is connected to the respective leading ends of one pair of the inner first piezoelectric actuators 8a, 8c which are disposed across the anchor end of the torsion bar 2a.

Meanwhile, the leading end of the other torsion bar 2b is connected to the mirror 1 and the anchor end thereof is connected to the respective leading ends of one pair of the inner first piezoelectric actuators 8b, 8d which are disposed across the anchor end of the torsion bar 2b. The anchor ends of these first piezoelectric actuators 8a-8d are respectively connected to and supported by the inner side of the movable frame 9 which is installed to surround the mirror 1 and the first piezoelectric actuators 8a-8d.

The movable frame 9 is rectangular in its shape in this example, and its sides arranged in the direction orthogonal to the torsion bars 2a, 2b are connected, respectively, to the leading ends of a pair of the outer second piezoelectric actuators 10a, 10b, which are disposed across the movable frame 9. Also, the anchor ends of these second piezoelectric actuators 10a, 10b are connected to and supported by the support 11 which is installed to surround the movable frame 9 and a pair of these piezoelectric actuators 10a, 10b.

Each of the first piezoelectric actuators 8a-8d is composed of one piezoelectric cantilever. Each piezoelectric cantilever is equipped with a supporting body 4a (4b, 4c, 4d), a lower electrode 5a(5b, 5c, 5d), a piezoelectric body 6a (6b, 6c, 6d), and an upper electrode 7a (7b, 7c, 7d).

Also, the second piezoelectric actuator 10a is composed of four connected piezoelectric cantilevers (counting from the leading end side of the piezoelectric actuator 10a, two odd-numbered piezoelectric cantilevers 3e and two even-numbered piezoelectric cantilevers 3f).

The other second piezoelectric actuator 10b is composed of four connected piezoelectric cantilevers (counting from the leading end side of the piezoelectric actuator 10b, two odd-numbered piezoelectric cantilevers 3g and two even-numbered piezoelectric cantilevers 3h). Each of the piezoelectric cantilevers 3e-3h is equipped with a supporting body 4e (4f, 4g, 4h), a lower electrode 5e (5f, 5g, 5h), a piezoelectric body 6e (6f, 6g, 6h), and an upper electrode 7e (7f, 7g, 7h).

In the second piezoelectric actuator 10a, four piezoelectric cantilevers 3e, 3f are disposed side by side so that their longitudinal directions are the same, and both ends of the piezoelectric cantilevers 3e, 3f are aligned so that the distance between them allows a translational drive, which will be described later. Furthermore, each of the piezoelectric cantilevers 3e, 3f is connected so as to be bent away from the adjacent piezoelectric cantilevers.

Also, in the other second piezoelectric actuator 10b, four piezoelectric cantilevers 3g, 3h are disposed side by side so that their longitudinal directions are the same, and both ends of the piezoelectric cantilevers 3g, 3h are aligned so that the distance between them allows a translational drive, which will be described later. Furthermore, each of the piezoelectric cantilevers 3g, 3h is connected so as to be bent away from the adjacent piezoelectric cantilevers.

On the support 11, the optical deflector 71 is equipped with an upper electrode pad 12a and a lower electrode pad 13a for applying a drive voltage between the upper electrodes 7a, 7c and the lower electrodes 5a, 5c, respectively, of one pair of the first piezoelectric actuators 8a, 8c, and also with an upper electrode pad 12b and a lower electrode pad 13b for applying a drive voltage between the upper electrodes 7b, 7d and the lower electrodes 5b, 5d, respectively, of the other pair of the first piezoelectric actuators 8b, 8d.

Also, on the support 11, the optical deflector is equipped with upper electrode pads 12c, 12d for applying a drive voltage between the odd-numbered upper electrodes 7e, 7g and the odd-numbered lower electrodes 5e, 5g, respectively, of one pair of the second piezoelectric actuators 10a, 10b; upper electrode pads 12e, 12f for applying a drive voltage between the even-numbered upper electrodes 7f, 7h and the even-numbered lower electrodes 5f, 5h, respectively, of one pair of the second piezoelectric actuators 10a, 10b; a lower electrode pad 13c shared by the upper electrode pads 12c, 12e; and lower electrode pad 13d shared by the upper electrode pads 12d, 12f.

The lower electrodes 5a-5h and the lower electrode pads 13a-13d are formed by applying a patterning process to a thin metal film (two-layer thin metal film in the present embodiment; hereinafter also referred to as a lower electrode layer) on a silicon substrate using a semiconductor planar process. For the material for this thin metal film, titanium (Ti) for the first layer (lower layer) and platinum (Pt) for the second layer (upper layer) may be used.

In more detail, the lower electrodes 5a-5d of the piezoelectric cantilevers of the first piezoelectric actuators 8a-8d are formed on the almost entire surface of the supporting bodies 4a-4d, and the lower electrodes 5e-5h of the piezoelectric cantilevers of the second piezoelectric actuators 10a, 10b are formed on the almost entire surface of the supporting bodies (the entirety of the combination of the straight section and the joining section) 4e-4h, respectively. Furthermore, the lower electrode pads 13a-13d establish electric conduction to the lower electrodes 5a-5h via the lower electrode layer on the support 11 and the movable frame 9.

The piezoelectric bodies 6a-6h are formed on the lower electrodes 5a-5h, respectively, by applying a patterning process to one layer of an piezoelectric film (hereinafter also referred to as an piezoelectric layer) on the lower electrode layer using a semiconductor planar process so as to be separated from each other. For the materials for this piezoelectric film, for example, lead zirconate titanate (PZT), which is a piezoelectric material, may be used.

In more detail, the piezoelectric bodies 6a-6d of the piezoelectric cantilevers of the first piezoelectric actuators 8a-8d are formed on the almost entire surface of the supporting bodies 4a-4d, respectively, and the piezoelectric bodies 6e-6h of the piezoelectric cantilevers of the second piezoelectric actuators 10a, 10b are formed on the almost entire surface of the straight section of the supporting bodies 4e-4h, respectively.

The upper electrodes 7a-7h, the upper electrode pads 12a-12f, and the upper electrode wiring (not shown in the drawing) connecting them are formed by applying a patterning process to a thin metal film (in the present embodiment, one layer of a thin metal film; hereinafter also referred to as upper electrode layer) on the piezoelectric layer using a semiconductor planar process. For the material for this thin metal film, for example, platinum (Pt) or gold (Au) may be used.

In more detail, the upper electrodes 7a-7h of the piezoelectric cantilevers of the first and second piezoelectric actuators 8a-8d, 10a, 10b are formed on the almost entire surface of the piezoelectric bodies 6a-6h, respectively. Furthermore, the upper electrode pads 12a, 12b are connected to the upper electrodes 7a-7d via upper electrode wirings (not shown in the drawing), which are formed on the support 11, the sides of the supporting bodies 4e-4h, and on the movable frame 9.

Also, the upper electrode pads 12c-12f are connected to the upper electrodes 7e-7h via upper electrode wirings (not shown in the drawing), which are formed on the support 11 and on the sides of the supporting bodies 4e-4h. Here, the upper electrode wirings are installed on a plane in isolation to each other and is insulated from the lower electrode pads 13a-13d and the lower electrodes 5a-5h via interlayer(s).

The mirror 1 is equipped with a mirror supporting body 1b and a reflecting film of mirror plane (the reflecting plane) 1a, which is formed on the mirror supporting body 1b. The reflecting film of the mirror plane 1a is formed by applying a patterning process on a thin metal film on the mirror supporting body 1b (in the present embodiment, one layer of a thin metal film) using a semiconductor planar process. For the material for the thin metal film, for example, gold (Au), platinum (Pt), silver (Ag), or aluminum (Al) may be used.

Also, the mirror supporting body 1a, the torsion bars 2a, 2b, the supporting bodies 4a-4h, the movable frame 9, and the support 11 are integrally formed by patterning a semiconductor substrate that is composed of a plurality of layers. For the technology for patterning the silicon substrate, a semiconductor planar process using photolithography technique or dry etching technique, or a MEMS process may be used.

A gap 9' is provided between the mirror 1 and the movable frame 9, which enables the mirror 1 to rotate up to a predetermined angle. A gap 11' is provided between the movable frame 9 and the support 11, which enables the movable frame 9 to rotate up to a predetermined angle. The mirror 1, being formed integrally, is mechanically connected to the first piezoelectric actuators 8a-8d via the torsion bars 2a, 2b and is driven to rotate in response to the operations of the first piezoelectric actuators 8a-8d.

Also, the movable frame 9, being formed integrally, is mechanically connected to the second piezoelectric actuators 10a, 10b and is driven to rotate and translate in response to the driving of the second piezoelectric actuators 10a, 10b.

Furthermore, the optical deflector 71 is connected to a control circuit 20, which controls the deflection and scanning of the mirror 1. The control circuit 20 includes: a first control section 21, which controls the phase, frequency, deflection angle, and so forth of the deflection and scanning (rotational drive) of the mirror 1 around first axis x1 by controlling the phase, frequency, amplitude, waveform, and so forth of the drive voltage for the first piezoelectric actuators 8a-8d. The control circuit 20 also includes a second control section 22, which controls the phase, frequency, deflection angular displacement, and so forth of the deflection and scanning (rotational drive) and the translational drive of the mirror 1 along and around the second axis x2 by controlling the phase, frequency, amplitude, waveform, and so forth of the drive voltage applied to the second piezoelectric actuators 10a, 10b. Here, the second control section 22 uses a voltage obtained by superimposing voltage elements for the rotational drive and the translational drive of the mirror 1.

Next, the operation of the optical deflector 71 is described. First, a rotational drive around the first axis x1 by the first piezoelectric actuators 8a-8d is described. In the optical deflector 71, a first voltage and a second voltage are applied respectively between the upper electrodes 7a, 7c and the lower electrodes 5a, 5c to drive a pair of the first piezoelectric actuators 8a, 8c, which exhibits a bending deformation in an opposite direction to each other.

Here, the first voltage and the second voltage are alternating-current voltages (a sine wave, for example) with reverse phases with respect to each other or with a phase offset with respect to each other. Because of these bending deformations, a torsional displacement is generated in the torsion bar 2a, and a rotary torque centered at the torsion bar 2a is generated and acts on the mirror 1. Likewise, by applying the first voltage and the second voltage to the other pair of the first piezoelectric actuators 8b, 8d, respectively, a torsional displacement is generated in the torsion bar 2b in the same direction and the rotary torque centered at the torsion bar 2b acts on the mirror 1.

Therefore, by driving the first piezoelectric actuators 8a-8d, a rotary torque centered at the torsion bar 2a, 2b is generated and acts on the mirror 1. As a result, the mirror 1 rotates around the first axis x1 as shown by the arrows in FIG. 8, with the torsion bars 2a, 2b as the rotational center axis. By rotating the mirror 1, it becomes possible to scan a light beam in a first direction (horizontally, for example) at a predetermined first frequency and a predetermined first sweeping deflection angle. Here, in these first piezoelectric actuators 8a-8d, it is possible to scan a light beam at a larger deflection angle through a resonant drive by applying an alternating-current voltage at a frequency near the mechanical resonant frequency of the mirror 1 including the torsion bars 2a, 2b.

At the same time, in the optical deflector 71, a drive voltage is applied to a pair of outer second piezoelectric actuators 10a, 10b. Specifically, in the second piezoelectric actuator 10a, a third voltage is applied between the upper electrode pad 12c and the common lower electrode pad 13c to drive the odd-numbered piezoelectric cantilevers 3e. At the same time, a forth voltage is applied between the upper electrode pad 12e and the common lower electrode pad 13c to drive the even-numbered piezoelectric cantilevers 3f. Likewise, fifth and sixth voltages are applied to the opposed second piezoelectric actuator 10b to drive the piezoelectric cantilevers 3g, 3h.

Here, the voltage components for a rotational drive of the third and forth voltages should be such that the respective angular displacements of the odd-numbered piezoelectric cantilevers 3e and the even-numbered piezoelectric cantilevers 3f occur in opposite directions in relation to the vertical direction of the second piezoelectric actuator 10a.

For example, in case of displacing the leading end of the second piezoelectric actuator 10a in an upward direction (shown in FIG. 8 as the direction U), the odd-numbered piezoelectric cantilevers 3e should be displaced in an upward direction, while the even-numbered piezoelectric cantilevers 3f are displaced in an downward direction. In case of displacing the leading end of the second piezoelectric actuator 10a in a downward direction, the opposite procedure is taken. This also applies to the voltage component of the fifth and sixth voltages for a rotational drive.

Figure 9:
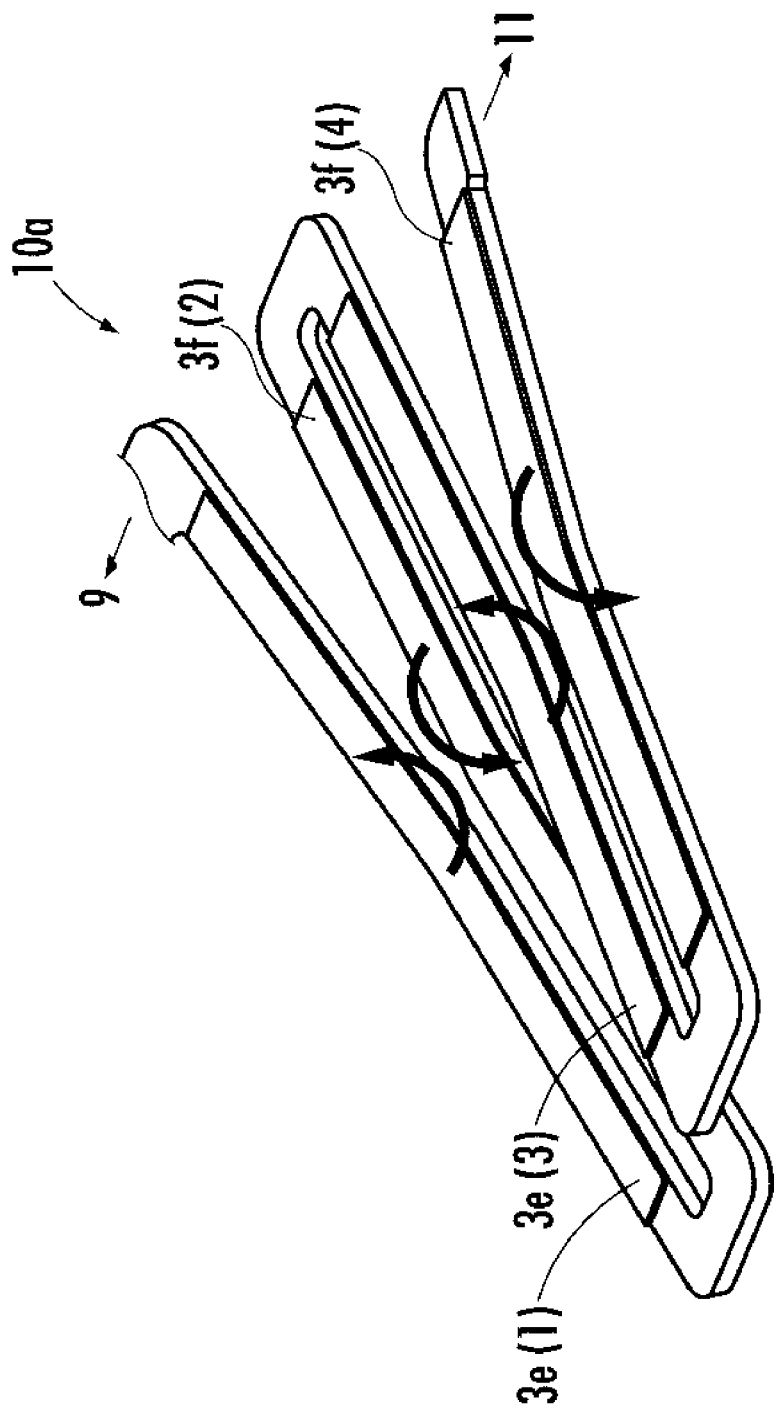
FIG. 9 is a drawing to explain a rotational drive of a second piezoelectric actuator of the optical deflector shown in the FIG. 8.

FIG. 9 schematically shows a driving status of the second piezoelectric actuators 10a in a vertical direction. FIG. 9 shows a case in which the leading end of the second piezoelectric actuator 10a is displaced in an upward direction. In addition, the i-th piezoelectric cantilever counting from the side of the movable frame 9 is indicated as (i) in the following explanation (i=1-4).

As shown in FIG. 9, by applying voltages to the second piezoelectric actuator 10a, the odd-numbered piezoelectric cantilevers 3e counting from the side of the movable frame 9 (leading end side) are bent and deformed in an upward direction, while the even-numbered piezoelectric cantilevers 3f are bent and deformed in a downward direction. Here, a downward angular displacement is generated in the leading end of the piezoelectric cantilever 3f(4) with its anchor end being connected to the support 11 as a supporting point.

Also, an upward angular displacement is generated in the leading end of the piezoelectric cantilever 3e(3) with its anchor end being connected to the leading end of the piezoelectric cantilever 3f(4) as a supporting point. Also, a downward angular displacement is generated in the leading end of the piezoelectric cantilever 3f(2) with its anchor end being connected to the leading end of the piezoelectric cantilever 3e(3) as a supporting point.

Also, an upward angular displacement is generated in the leading end (connected to the movable frame 9) of the piezoelectric cantilever 3e(1) with its anchor end being connected to the leading end of the piezoelectric cantilever 3f(2) as a supporting point. As a result, in the second piezoelectric actuator 10a, an angular displacement is generated with a size corresponding to the aggregate size of the bending deformations of the piezoelectric cantilevers 3e, 3f.

Also, the voltage components for a translational drive of the third and forth voltages should be such that the respective angular displacements of the odd-numbered piezoelectric cantilevers 3e and the even-numbered piezoelectric cantilevers 3f occur in the same direction in relation to the in-plane direction of the optical deflector 71. For example, in case of displacing the leading end of the second piezoelectric actuator 10a in the right direction (shown in FIG. 8 as the direction R), both the odd-numbered piezoelectric cantilevers 3e and the even-numbered piezoelectric cantilevers 3f should be displaced in the right direction. In case of displacing the leading end of the second piezoelectric actuator 10a in the left direction, the opposite procedure is taken. This applies to the voltage component of the fifth and sixth voltages for a translational drive.

Figure 10A:
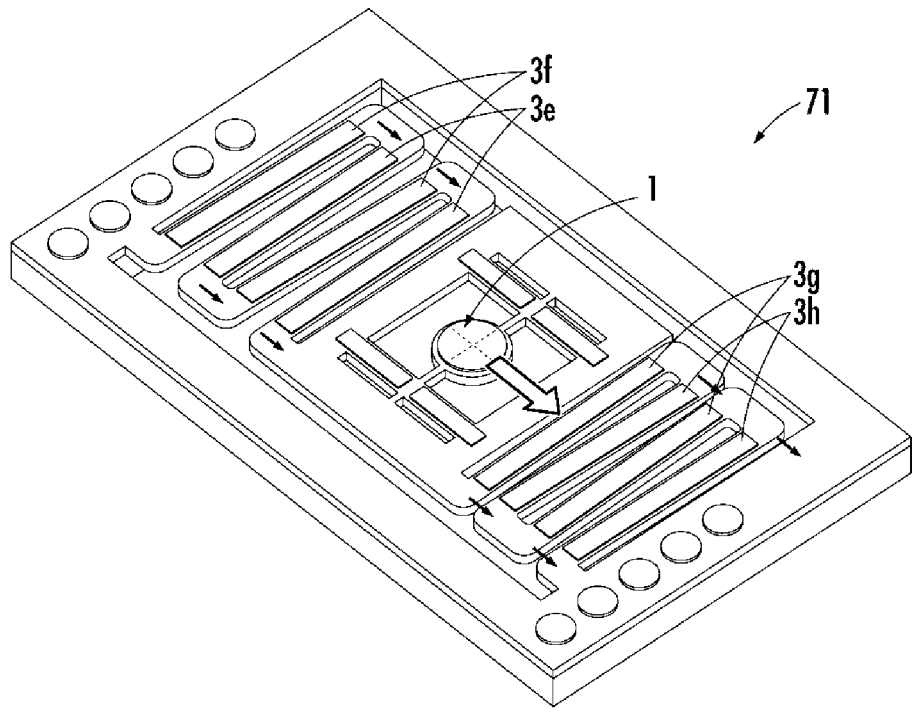
FIGS. 10A-10B illustrate a translational drive of the second piezoelectric actuator of the optical deflector shown in the FIG. 8.
Figure 10B:
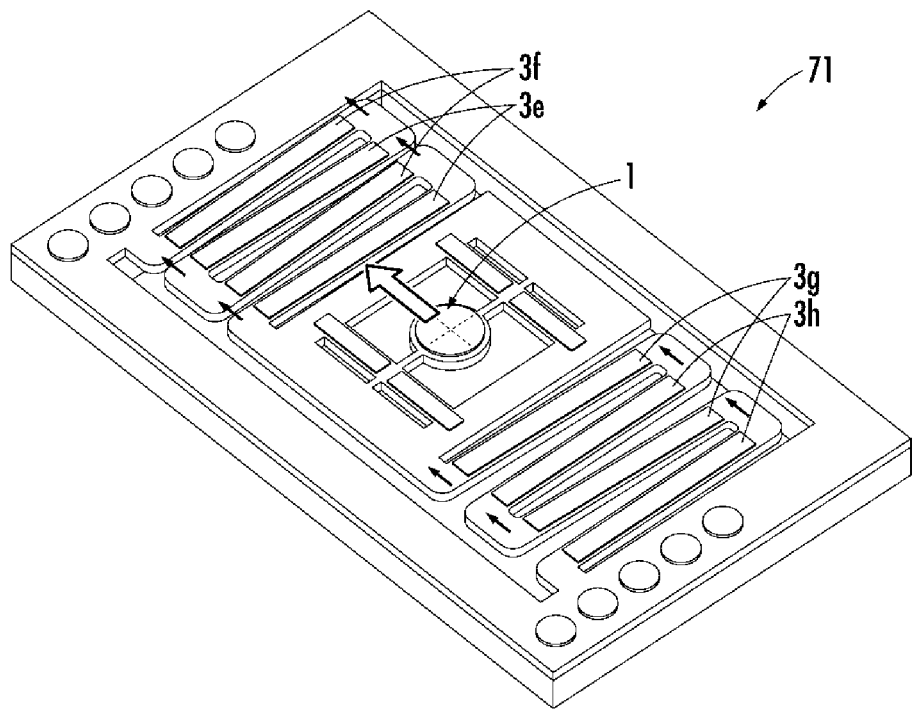

FIGS. 10A-10B schematically show a driving status of the second piezoelectric actuators 10a, 10b in the in-plane direction. FIG. 10A shows the status in which the mirror 1 is translated and driven in the right direction, and FIG. 10B shows the status in which the mirror 1 is translated and driven in the left direction.

In FIG. 10A, with regard to the second piezoelectric actuator 10a, an angular displacement is generated in the right direction in the leading end of the piezoelectric cantilevers 3e, 3f, respectively, with its anchor end as a supporting point. As a result, in the second piezoelectric actuator 10a, a translational displacement occurs in the right direction with the size corresponding to the aggregate size of the bending deformations of the piezoelectric cantilevers 3e, 3f.

Also, with regard to the second piezoelectric actuator 10b, an angular displacement is generated in the right direction in the leading end of the piezoelectric cantilevers 3g, 3h with its anchor as a supporting point, as shown by the arrows in the drawing. As a result, in the second piezoelectric actuator 10b, a translational displacement occurs in the right direction with the size corresponding to the aggregate size of the bending deformations of the piezoelectric cantilevers 3g, 3h. Due to these translational displacements, as shown by an outline arrow in the drawing, the mirror 1, the torsion bars 2a, 2b, the first piezoelectric actuators 8a-8d, and the movable frame 9 integrally translate in the right direction.

As described above, by driving the third-sixth voltages, the second piezoelectric actuators 10a, 10b are driven to generate angular displacements in their respective leading ends about the same central axis line, and at the same time, to generate translational displacements parallel to the central axis line. Due to the angular displacements, the movable frame 9, as shown by the arrow in FIG. 8, rotates around the second axis x2, which is orthogonal to the first axis x1.

As a result, the mirror 1 and the movable 9 independently rotate without interfering with each other's motion. And, due to this rotation of the movable frame 9, the mirror 1 and the first piezoelectric actuators 8a-8d integrally rotate, and the mirror 1 rotates independently from the rotation caused by driving the first piezoelectric actuators 8a-8d.

Thus, by rotating the mirror 1, it becomes possible to scan a light beam in a second direction (vertically, for example) at a prescribed second frequency and at a prescribed second sweeping deflection angle. Also, along with the rotation by the angular displacement, the mirror 1, the torsion bars 2a, 2b, the first piezoelectric actuators 8a-8d, and the movable frame 9 integrally translate in parallel to the second axis x2 due to the translational displacement, as shown by the arrows in FIG. 8. As a result, it becomes possible to translate and vibrate the mirror 1 at a prescribed third frequency and in a prescribed displacement range (over 50 μm, for example).

WORKING EXAMPLE 1

As a working example 1, the actuator for optical deflector 60 of the present embodiment, in which the optical deflector 71 was secured on the base 43, was mounted on the package and was tested for its drive characteristics. For the present working example, the thickness of the SOI substrate of the actuator for optical deflector 60 was set to 50 μm for the active layer, 2 μm for the thickness of the interlayer oxide film layer, and 525 μm for the thickness of the handling layer, respectively, and the thickness of the thermally-oxidized silicon film was 500 nm. Also, the thickness of the lower electrode layer (Ti/Pt) was set to 50 nm for Ti and 150 nm for Pt, while the thickness of the piezoelectric layer was 3 μm and that of the upper electrode layer (Pt) was 150 nm.

Also, in the present working example, the aforementioned optical deflector 71 was designed to have a resonant frequency at 15 kHz. In this optical deflector, an alternating-current voltage of an amplitude voltage $V_{pp}$ of 20 V and a frequency of 15 kHz was applied as a drive signal to the first piezoelectric actuators 8a-8d, and an alternating-current voltage of an amplitude voltage $V_{pp}$ of 20 V and a frequency of 60 Hz was applied as a drive signal to the second piezoelectric actuators 10a, 10b. A resonant drive was employed on the first piezoelectric actuators 8a-8d for horizontal axis scan, and a non-resonant drive was employed on the second piezoelectric actuators 10a, 10b for vertical axis scan. As a result, the maximum sweeping deflection angles of ±9.0° for the horizontal axis and ±7.0° for the vertical axis were obtained.

Furthermore, an alternating-current voltage of an amplitude voltage $V_{pp}$ of 25 V and a frequency of 500 Hz was applied as a drive signal via the upper electrode wiring 47 to the upper electrodes 45a, 45b of the piezoelectric actuators 42a, 42b of the actuator for optical deflector 60. Also, an alternating-current voltage having a reversed phase as compared to the alternating-current voltage which was applied to the upper electrodes 45a, 45b, was applied as a drive signal via the upper electrode wiring 48 to the upper electrodes 46a, 46b of the piezoelectric actuators 42a, 42b of the actuator for optical deflector 60.

As a result, the piezoelectric actuators 42a, 42b of the actuator for optical deflector 60 exhibited a translational vibration. In the present working example, the amplitude of the translational vibration was observed to be 100 μm.

Also, an image was displayed by an image display device which was equipped with the optical deflector device that had the package mounted with the actuator for optical deflector 60 in which the optical deflector 71 was secured on the base 43 according to the second embodiment shown in FIG. 7. The image display device also included a laser beam source, a half mirror (beam splitter), and a screen.

The laser beam source, the half mirror, and the screen were secured on the predetermined location. A laser beam emitted from the laser beam source received a prescribed intensity modulation, passed through a single or a group of light collecting lens(es), passed through the half mirror, and entered the mirror 1 of the two-dimensional optical deflector 71. The incident laser beam was then deflected in the directions according to the deflection angles of the mirror 1, and the light beam was split by the half mirror and was projected onto the screen to form an image. The optical deflector 71 performed a raster scan by the incident laser beam in the horizontal and vertical directions, scanned a rectangle region on the screen in the horizontal and vertical directions, and displayed the image.

When the image was displayed on the screen as described above, the existence of speckle noise of the image on the screen was visually checked before and after operating the actuator 60 for optical deflector; that is, before and after applying the voltage component as a drive signal to the piezoelectric actuators 42a, 42b. The result showed that seven out of ten observers recognized a reduction of speckle noise.

With respect to flicker noise, no difference was observed before and after operating the actuator 60 for optical deflector. It has been understood that the difference in flicker noise was not recognized because the piezoelectric actuators 42a, 42b of the actuator for optical deflector 60 vibrated at a frequency of 500 Hz, which is the rate at which human eye cannot follow.

Third Embodiment

FIG. 11 shows a configuration of an optical window included in the package which mounts the actuator 60 for optical deflector, according to a third embodiment of the present invention. The actuator 60 for optical deflector of the present embodiment has a configuration in which the optical window 70 of the second embodiment explained above is modified to generate an in-plane optical path difference in a light beam transmitting the aforementioned optical window. The elements that are the same as those of the first embodiment and the second embodiment are described with the same reference numerals.

Instead of the transparent optical window 70 used in the second embodiment, the third embodiment uses an optical window 70a in which a checkerboard-like pattern is formed by a patterned optical multilayer film. Here, the checkerboard-like pattern generates a very small difference in the optical path of the laser beam entering the optical deflector 71. In FIG. 11, parts a1 show the areas in which the optical multilayer film is not formed, while the shaded parts a2 are the areas in which the optical multilayer film is formed.

For the material for the optical multilayer film, for example, $TiO_2$, $Ta_2O_5$, $Nb_2O_5$, or the like may be used as a high refractive index material, and $SiO_2$ or the like may be used as a low refractive index material. These high refractive material layers and refractive index layers are laminated to form the optical multilayer film. Also, the thickness of the optical multilayer film is, for example, set to 100 nm for each layer and 2-5 μm in total. Further, the size of the checkerboard-like pattern is, for example, set to 3-5 μm square for each grid. Other configurations and operations are the same as the second embodiment.

WORKING EXAMPLE 2

As a working example 2, the optical window 70a of the third embodiment was manufactured, and the actuator 60 for optical deflector in which the optical deflector 71 was secured on the base 43 was mounted on the package of the second embodiment.

In the present working example, the optical deflector 71, which was designed in a similar way to the working example 1, was secured on the base 43 of the actuator 60 for optical deflector. This actuator 60 for optical deflector was mounted to the inside of the package (outer frame) 72 equipped with the aforementioned optical window 70a. The alternating-current voltage was applied to the optical deflector 71 as well as to the piezoelectric actuator 42 of the actuator 60 for optical deflector in a similar way to the working example 1.

Speckle noise of the image on the screen was visually compared before and after operating the actuator 60 for optical deflector; that is, before and after applying the voltage component as a drive signal to the piezoelectric actuators 42a, 42b. The result showed that eight out of ten observers recognized a reduction of the speckle noise.

Forth Embodiment

Figure 12:
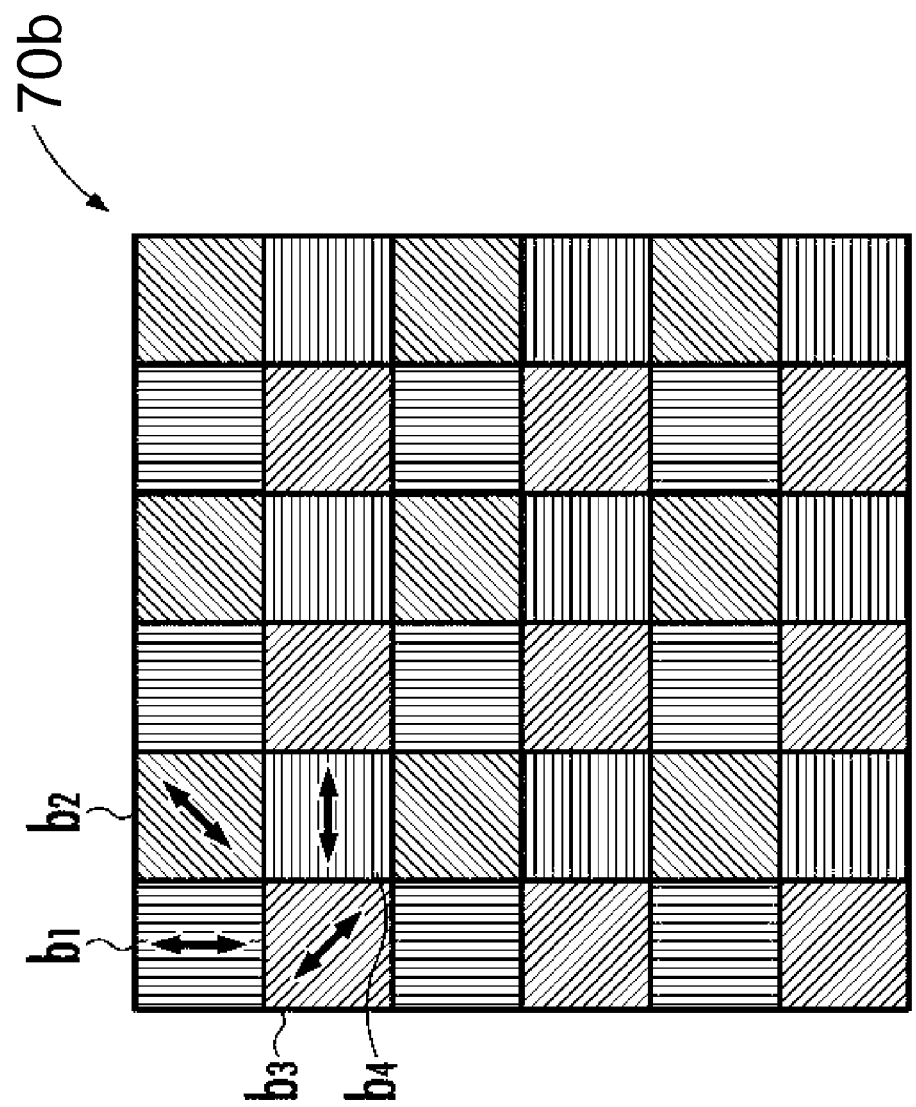
FIG. 12 is a drawing to illustrate another example of the optical window shown in FIG. 7.

FIG. 12 shows a configuration of an optical window included in the package of the optical deflector of the present embodiment of the present invention. The optical deflector of the present embodiment has a configuration in which the optical window included in the package mounting the optical deflector of the second embodiment generates an in-plane modulation in the polarization status of a light beam transmitting the aforementioned optical window. The configurations that are the same as those of the first embodiment and the second embodiment are shown by the same reference numerals, and their descriptions are omitted herein.

In the present embodiment, a plane-polarizing element, which includes polarizing elements b1-b4 that modulate a transmitting light in four directions, is provided in the optical window 70b, and the polarization status of a laser beam, which enters the optical deflector 71 and is scanned, is spatially changed by this plane-polarizing element. The grating of the polarizing elements b1-b4 is set, for example, to about 200 um in pitch. Also, the element size of the polarizing elements b1-b4 is set, for example, to 3-5 μm square. Other configurations and operations are the same as the second embodiment.

WORKING EXAMPLE 3

As a working example 3, the optical window 70b of the fourth embodiment was used, and the actuator 60 for optical deflector in which the optical deflector 71 was secured on the base 43 was mounted on the package.

In this working example, the optical deflector 71, which was designed in a similar way to the working example 1, was secured on the base 43 of the actuator 60 for optical deflector. The actuator 60 for optical deflector was mounted to the package 72 equipped with the aforementioned optical window 70b. An alternating-current voltage was applied to the optical deflector 71 as well as to the piezoelectric actuator 42 of the actuator 60 for optical deflector in a similar way to the working example 1.

Speckle noise of the image on the screen was visually compared before and after operating the actuator 60 for optical deflector; that is, before and after applying the voltage component as a drive signal to the piezoelectric actuators 42a, 42b. The result showed that nine out of ten observers recognized a reduction of the speckle noise.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

I claim:

1. An optical device comprising:
   an optical deflector including a movable frame and a movable mirror for controllably deflecting a light beam, the optical deflector further including at least one piezoelectric actuator that rotates a torsion bar connected to said mirror to controllably rotate, relative to the movable frame, the movable mirror around a first axis that is in parallel with a resting plane of the mirror, the optical deflector further including a support and at least another piezoelectric actuator to rotate, relative to the support, said movable frame around a second axis that is substantially perpendicular to the first axis and that is substantially in parallel with the resting plane of said mirror, said another piezoelectric actuator also being configured to move said movable frame relative to the support in lateral directions substantially in parallel to the resting plane; and
   an actuator unit for said optical deflector including a base on which said optical deflector is mounted, a supporting body, and at least one piezoelectric actuator, one end of the at least one piezoelectric actuator being connected to said base that mounts said optical deflector thereon, another end of said piezoelectric actuator being connected to said supporting body, said piezoelectric actuator being configured to be controllably activated to generate a translational movement of said base relative to the supporting body.

2. The optical device according to claim 1, wherein the optical deflector is formed substantially integrally using at least one of a semiconductor planar process and a MEMS process, and
   wherein the actuator unit is formed substantially integrally using at least one of a semiconductor planar process and a MEMS process.

3. The optical device according to claim 1, wherein said at least one piezoelectric actuator in the actuator unit includes a plurality of piezoelectric cantilevers connected in serious in an accordion shape, wherein any pair of the adjacent piezoelectric cantilevers in said plurality is configured such that piezoelectric deformations of the pair of the adjacent piezoelectric cantilevers occur in the same direction so that said at least one piezoelectric actuator generates a translational motion as a whole.

4. The optical device according to claim 3, further comprising an optical window over the optical deflector for transmitting light that enters towards said mirror and light that is reflected from said mirror, the optical window being configured to reduce a coherence of the light that passes therethrough.

5. The optical device according to claim 4, wherein the optical window has a first portion having a first optical path length and a second portion having a second optical path length that is different from the first optical path length with respect to a light beam that passes through the optical window.

6. The optical device according to claim 4, wherein the optical window has a plurality of portions that are grouped into a plurality of groups, the portions belonging to each group allowing a respective prescribed polarization component of a light beam to pass therethrough, and the prescribed polarization components for the respective groups differ from one another in their directions of the polarization.

7. The optical device according to claim 4, further comprising an outer frame for housing said actuator unit for the optical deflector and the optical deflector mounted on the actuator unit, the outer frame having said optical window attached thereon.

8. The optical device according to claim 1, wherein said at least one piezoelectric actuator in the actuator unit includes a pair of piezoelectric actuators, each of the piezoelectric actuators including a plurality of piezoelectric cantilevers connected in serious in an accordion shape, wherein in each of the piezoelectric actuator in the actuator unit, any pair of the adjacent piezoelectric cantilevers in said plurality of piezoelectric cantilevers is configured such that piezoelectric deformations of the pair of the adjacent piezoelectric cantilevers occur in opposite directions with respect to each other so that the piezoelectric actuator generates a vertical motion as a whole, and wherein one of said pair of the piezoelectric actuators in the actuator unit is disposed along one side of the base, and the other one of said pair of the piezoelectric actuators in the actuator unit is disposed along another side of the base opposite to said one side.

9. The optical device according to claim 8, wherein the actuator unit further includes a damper disposed on a side of the base for damping excess movements of said base.

10. The optical device according to claim 8, wherein each of the piezoelectric cantilevers includes at least one pair of electrodes to receive voltage signals to generate piezoelectric displacements in the piezoelectric cantilever.

11. The optical device according to claim 8, wherein each of the piezoelectric cantilevers includes a silicon layer, an insulating layer on the silicon layer, a lower electrode layer on the insulating layer, a piezoelectric layer on the lower electrode layer, two first upper electrodes electrically connected to each other on the piezoelectric layer, and two interconnected second upper electrodes electrically connected to each other on the piezoelectric layer, and wherein on the piezoelectric layer, the two first upper electrodes and the two second upper electrodes are extended generally in a longitudinal direction along the piezoelectric cantilever and are disposed generally in a diagonal arrangement.

12. The optical device according to claim 11, further comprising a control unit for providing voltage signals between the first upper electrodes and the lower electrode layer and between the second upper electrodes and the lower electrode layer, wherein the voltage signal applied between the first upper electrodes and the lower electrode differs in phase from the voltage signal applied between the second upper electrode and the lower electrode so that each cantilever exhibits a lateral deformation.

13. The optical device according to claim 12, wherein in each of said piezoelectric actuators in the actuator unit, positions of the first upper electrodes and the second upper electrodes in one piezoelectric actuator are exchanged in an adjacent piezoelectric actuator connected to said one piezoelectric actuator so that the lateral deformation is cooperatively enhanced in the piezoelectric actuator as a whole.

* * * * *